United States Patent [19]
Gottscho et al.

[11] Patent Number: 5,179,029
[45] Date of Patent: Jan. 12, 1993

[54] HYDROGEN PLASMA PASSIVATION OF GAAS

[75] Inventors: Richard A. Gottscho, Maplewood, N.J.; Bryan L. Preppernau, Fairborn, Ohio

[73] Assignee: AT&T Bell Laboratories, Murray Hill, N.J.

[21] Appl. No.: 643,688

[22] Filed: Jan. 18, 1991

Related U.S. Application Data

[63] Continuation of Ser. No. 477,012, Feb. 7, 1990, abandoned.

[51] Int. Cl.$^5$ ............. H01L 21/00; H01L 21/02; H01L 21/265; H01L 21/329
[52] U.S. Cl. ............................. 437/10; 437/937; 427/569; 156/643
[58] Field of Search ............. 437/17, 173, 937, 949, 437/10; 427/38, 39; 156/643

[56] References Cited

U.S. PATENT DOCUMENTS

| | | | |
|---|---|---|---|
| 4,266,986 | 5/1981 | Benton et al. | 437/173 |
| 4,343,830 | 8/1982 | Sarma et al. | 427/38 |
| 4,610,731 | 9/1986 | Chevallier et al. | 437/22 |
| 4,645,683 | 2/1987 | Gourrier et al. | 437/176 |
| 4,936,781 | 6/1990 | Mircea et al. | 437/133 |
| 5,059,551 | 10/1991 | Chevallier et al. | 437/96 |

FOREIGN PATENT DOCUMENTS 0290230 11/1989 Japan .

OTHER PUBLICATIONS

Chevallier, J. Donor neutralization in GaAs(Si) by atomic hydrogen, Appl. Phys. Lett. 47(2), Jul. 1985, pp. 108–110.

Paccagnella, A., Schottky diodes on hydrogen plasma treated n-GaAs surfaces, Appl. Phys. Lett. 55(3), Jul. 1989, pp. 259–261.

Omel'yanovskii, E., Passivation of shallow impurity centers in gallium arsenide by atomic hydrogen, Sov. Phys.-Semicond. (USA), vol. 21, No. 10, Oct. 1987, pp. 1068–1069.

Omeljanovsky, E., Hydrogen passivation of defects and impurities in GaAs and InP, J. Electron. Mater. (USA), vol. 18, No. 6, Nov. 1989, pp. 659–670.

Pan, N., Si donor neutralization high-purity GaAs, Appl. Phys. Lett. (USA), vol. 50, No. 25, Jun. 1987, pp. 1832–1834.

Chevallier, J., Correlation between hydrogen diffusion and donor neutralization in hydrogenated n-GaAs:Si, 14th Inter. Conf. on Defects in Semiconductors, vol. 10–12, pt. 2, 1986, pp. 591–595.

Chevallier, J., Passivation of deep level defects in Molecular beam epitaxial GaAs by hydrogen plasma exposure, Appl. Phys, Lett. (USA) vol. 49, No. 17, Oct. 1986, pp. 1098–1100.

Pearton, S., Hydrogenation of shallow-donor levels in GaAs, J. Appl. Phys. (USA), vol. 59, No. 8, Apr, 1986, pp. 2821–2827.

Pearton, S., Hydrogen passivation of deep donor centers in high-purity epitaxial GaAs, Electron. Lett. (GB), vol. 18, No. 16, Aug. 1982, pp. 715–716.

"Surface Passivation of GaAs" H. H. Lee, R. J. Racicot, and S. H. Lee; Appl. Phys. Lett. 54(8), Feb. 20, 1989; (pp. 724–726).

*Primary Examiner*—Tom Thomas
*Assistant Examiner*—B. Everhart
*Attorney, Agent, or Firm*—Peter V. D. Wilde; Glen E. Books

[57] ABSTRACT

Hydrogen Plasma surface passivation of III-V Semiconductors is critically dependent on exposure time and pressure because of competition between plasma passivation and damage. Proper control of pressure according to the invention yields reproducible and stable passivation. Improved passivation is obtained using high pressure hydrogen plasmas, i.e. above 1 Torr.

5 Claims, 2 Drawing Sheets

HYDROGEN PLASMA PASSIVATION OF GAAS

This application is a continuation of application Ser. No. 07/477,012, filed on Feb. 7, 1990, now abandoned.

FIELD OF THE INVENTION

The invention relates to surface passivation of III-V semiconductors by plasma processing.

BACKGROUND OF THE INVENTION

The well-known deficiencies in the surface properties of GaAs have stimulated many attempts to passivate the surface, reduce the surface state density, and unpin the surface Fermi level. There are many reasons why it is desirable to reduce the surface state density of III-V compound semiconductors and GaAs in particular. A reduction in surface state density would lead to improved field effect transistor (FETs) by lowering surface-related leakage currents and by increasing the Schottky barrier height. This would allow the fabrication of digital logic circuits with increased noise margins and relaxed requirements on threshold voltage uniformities of the component FETs. In addition, unpinning the surface Fermi level would allow advances in metal-insulator-semiconductor (MIS) capacitor and MISFET technology. For photonic devices, it is important for enhancing power output to reduce the surface recombination velocity and increase carrier lifetime. Passivation may be carried out prior to processing as a cleaning step, or after processing to remove process-induced damage.

A variety of wet chemical and photochemical treatments have been used to passivate GaAs but controversy remains as to their effectiveness in unpinning the Fermi level. Nonetheless, it is clear that photoluminesence (PL) yield is enhanced by using these surface treatments. In fact, passivation is operationally defined in terms of this enhancement in quantum yield. Although large increases in PL yield have been observed, the enhancements tend to be short-lived. We are aware of only one case where the enhancement persisted for more than a few hours (See H. H. Lee, R. J. Racicot, and S. H. Lee, Appl. Phys. Lett. 54,724 (1989). Occasionally, realtime PL monitoring has been used to monitor the effectiveness and kinetics of these wet chemical treatments.

To improve process control and management of environmental hazards, it is desirable to replace wet chemical processing with dry processing. In particular, plasma methods are effective for not only etching but also deposition, cleaning, and passivation. Recently, $H_2$ plasmas operated at low pressure have been used to clean GaAs of residual As and $As_2O_3$. Similar plasma treatments have also been reported for InP surface cleaning. A variety of reactor configurations have been employed: electron cyclotron resonance (ecr) microwave, multi-polar, and rf diode. However, in these reports choice of optimal exposure times, which have ranged from 5 s to 30 min, and operating pressures, which have ranged from $10^{-4}$ to $10^{-2}$ Torr, is not discussed. Similarly, the consequences of reactor geometry or excitation mode choice have not been addressed. In one case the properties of Schottky diodes made on hydrogen plasma treated n-GaAs surfaces was studied as a function of the treatment temperature. The conclusion was that plasma passivation is ineffective for temperatures below 200° C. (See A. Paccagnella, Appl. Phys. Lett. Vol. 55, No. 3, Jul. 17, 1989, pages 259–261). A similar conclusion has been made for hydrogen plasma treatment of InP surfaces. However, as we describe here, such conclusions depend on other plasma parameters. It is the recognition of the role of those parameters that leads to the inventive process.

Real-time monitoring of PL from GaAs during hydrogen plasma passivation clearly provides the means to investigate the effects of processing conditions such as exposure time, pressure, and temperature. (See U.S. patent application Ser. No. 07/402,030 filed Sep. 1, 1989). In addition, the kinetics of plasma-surface reactions can be monitored by measuring real-time changes in PL yield. In general, PL yield is sensitive to changes in surface recombination velocity (S) and band bending. Clearly, PL yield increases as S decreases. In addition, if the bands are bent and a space-charge field exists near the surface, separation of electrons and holes can lead to a reduction in radiative recombination efficiency. Thus, a reduction in band bending can increase PL yield. However, if S is reduced substantially, PL yield can increase despite an increase in band-bending. In n-GaAs, for example, passivation treatments tend to remove excess As from the surface and thereby reduce the As antisite defect density that pins the Fermi level near mid-gap. The Fermi level shifts to lower energy because the density of Ga antisite defects remains constant or even increases. Thus, the band bending increases. Ordinarily this would cause a decrease in PL yield as carriers are separated by the space-charge field. However, reduction of the near-mid-gap As antisite defect density decreases the non-radiative recombination rate causing an increase in PL yield.

STATEMENT OF THE INVENTION

In our discovery we used PL to monitor the effectiveness of and optimize processing conditions for hydrogen plasma passivation of native-oxide contaminated GaAs. We find that previously reported pressures and exposure times for passivation are far from optimal, and that low-temperature passivation is feasible. The effects of varying pressure and exposure time are critical. Specifically, we discovered that at pressures above 1 Torr, permanent plasma-induced surface damage does not occur (regardless of exposure time). We also discovered that effective passivation can be obtained at processing temperatures below 100° C.

DETAILED DESCRIPTION

Samples were either semi-insulating or n-type ($10^{17}$ $cm^{-3}$) GaAs (100) substrates. Initially, samples were inserted into a parallel-plate or hexode plasma reactor without any preprocess treatment. However, the magnitude of the PL enhancement and its long-term stability are widely variable from wafer to wafer, although for a give wafer the reproducibility was excellent; within a wafer lot, reproducibility was better than between lots. We found that when wafers are first dipped in concentrated (30%) HF or NH$_4$OH for 30 s, excellent PL yield reproducibility and long-term stability are observed. Therefore, results presented here correspond to samples first treated by dipping for 30 s in HF.

For PL monitoring, a pulsed N$_2$ pumped dye laser (Molectron) beam is injected into a fiber optic cable and passed through a polarizer to select p-polarized light. The output from the fiber is focussed onto the sample to spot size of about 0.15 cm$^2$ (1 cm long×0.15 cm wide). The angle of incidence is ~83° from normal (close to Brewster's angle) so that most of the light is efficiently coupled into the substrate. The laser pulse energy is typically 100 µJ of 500 nm light. PL is collected, collimated, and then focussed onto the entrance slit of a scanning monochromator.

Pulsed laser excitation is preferrable to continuous-wave excitation since the PL signal is superlinear with laser pulse energy. The non-linearity is believed to result from high-level injection and flattening of the bands. Thus, short-pulse, high intensity excitation with gated electronic detection eliminates the plasma background glow. In addition, a low duty-cycle, pulsed laser deposits less energy into the sample and thereby minimizes heating and photodegradation. Samples are plasma passivated in a parallel-plate, capacitively-coupled reactor.

Figure 1:
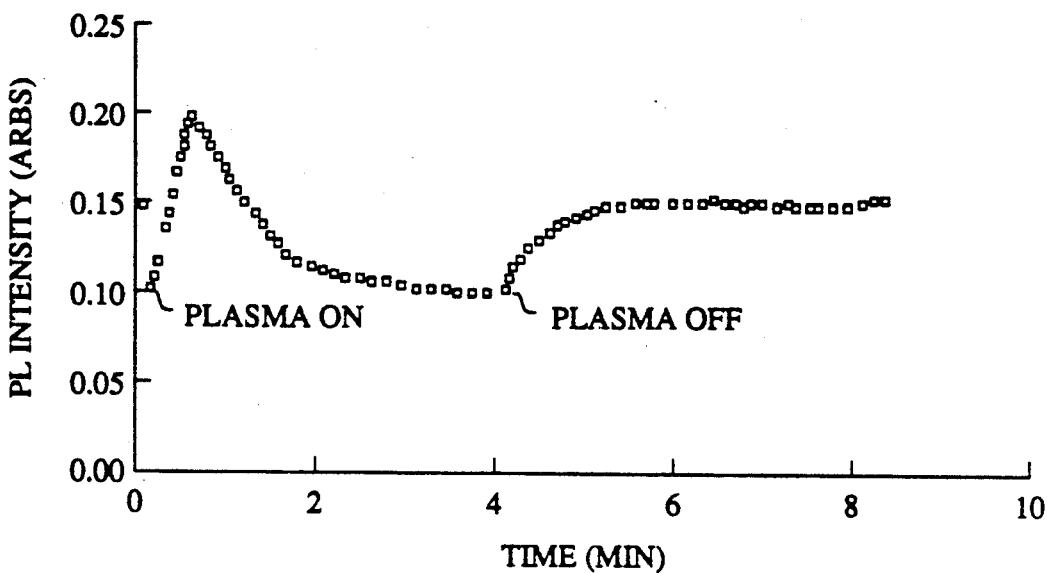
FIG. 1 shows PL intensity (in arbitrary units) vs. time for a passivation treatment at 0.2 Torr.

When GaAs is exposed to an H$_2$ plasma, H atoms created in the plasma react with native oxides and reduce the surface As concentration and thereby increase the PL yield. The plasma also produces energetic ion bombardment of the surface and can create damage that increases non-radiative recombination and decreases PL yield. Both of these effects are evident in FIGS. 1 and 2. In FIG. 1 a GaAs substrate is dipped in HF to thin the native oxide and then exposed to a hydrogen discharge with plasma parameters: 13 MHz, 20 W, 20° C., 2 sccm H$_2$, 0.2 Torr. When the plasma is gated on, the PL yield first decreases the surface charges negatively, then increases rapidly as As is removed from the surface, and finally plummets to a steady-state level below the initial value as the plasma irreversibly damages the surface. When the plasma is gated off, a slight increase in PL yield occurs and is attributed to discharging of the surface.

Similar results are obtained over a range of substrate temperatures (10°–50° C.), flow rates (0.4–40 sccm), and rf powers (4–20 W). Only pressure has a substantial effect on the magnitude and time-dependence of the PL enhancement (compare FIGS. 1 and 2). At higher pressures, sheath voltages are smaller, sheaths are more collisional, ion energies are smaller, and damage does not readily occur. As a result, PL enhancement is much larger at higher pressure and the decrease in PL that occurs on over-exposure is attributed solely to reversible charging of the surface by the plasma. Exposure time at pressures above about 1 Torr is not critical as can be seen by comparing final PL levels in FIGS. 2 and 3. The exposure time in the treatment yielding the data of FIG. 3 is optimized using PL monitoring as described and claimed in U.S. patent application Ser. No. 07/402,030 filed Sep. 1, 1989. In the treatments yielding the data of FIGS. 1 and 2 the surfaces were "overexposed". The overexposure permanently damages the surface when processed at 0.2 Torr. At 4 Torr no permanent damage occurs even through the surface may be overexposed. The pressure at which this critical transition occurs is between 0.5 and 1.5 Torr and the pressure recommended is above 1.0 Torr. Thus according to the invention surface passivation is optimized and is unexpectedly made independent of exposure time through the use of pressure levels above those used in the prior art.

Figure 2:
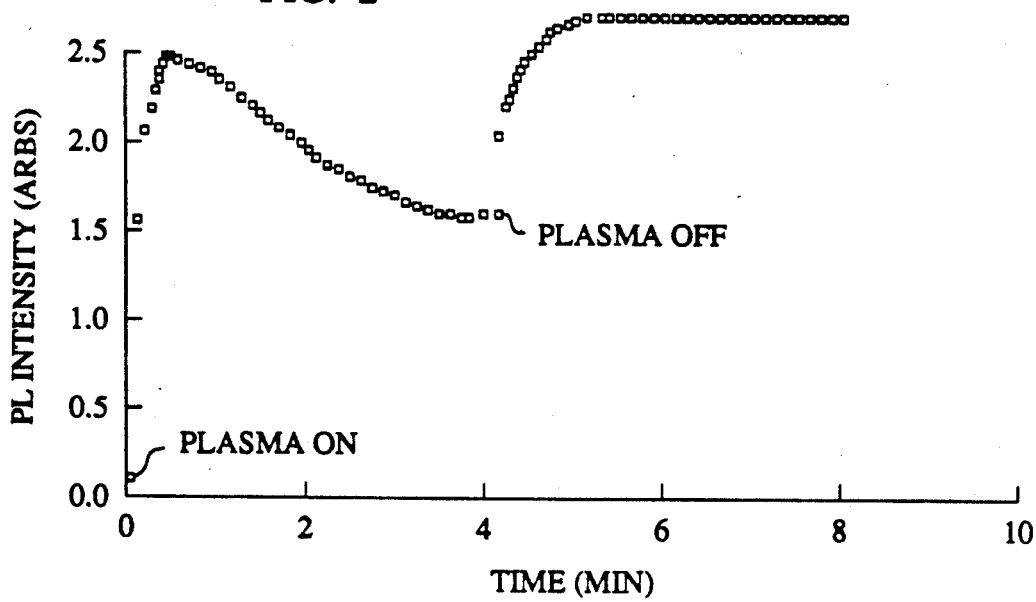
FIG. 2 shows PL intensity vs. time for an indentical passivation treatment except that the pressure is increased to 4 Torr.
Figure 3:
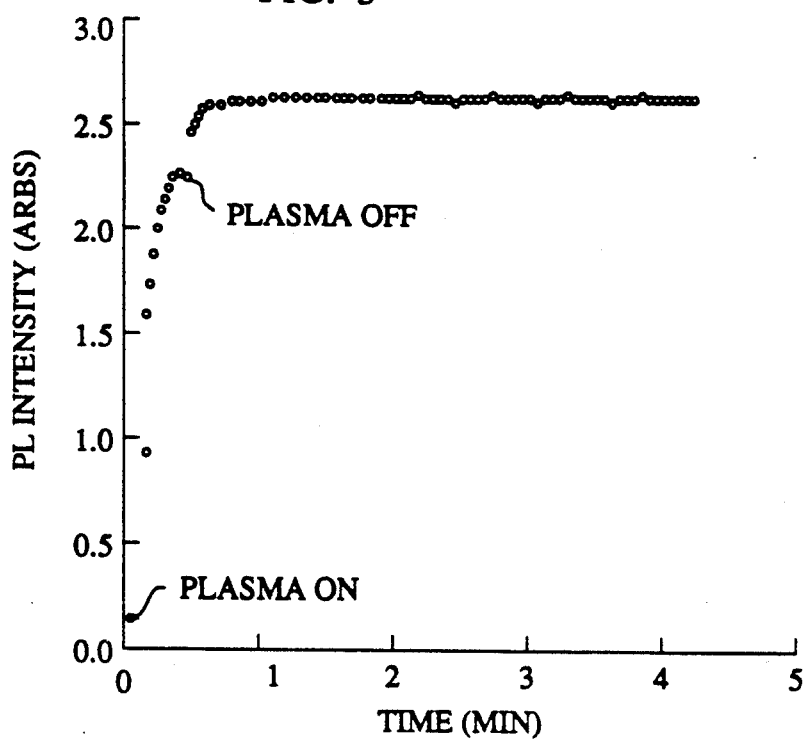
FIG. 3 shows PL intensity vs. time for a passivation treatment optimized for treatment time (i.e., where monitored PL peaks).

For plasma treatments under the conditions of FIGS. 2 and 3—high pressure, short times, low temperature—only the surface should be passivated (i.e. <1000 Å). Bulk passivation is not likely to play an important role in enhancing the PL yield. For a peak to peak voltage of 380 V, typical of our operating conditions, the time-averaged sheath voltage that ions can respond to in being accelerated to the surface is only ≈120 V. At 4 Torr, ions experience a significant number of charge exchange collisions as they traverse the ≈0.5 mm thick sheath and their average energy is reduced further to ≈50 V. With such low ion energies, the penetration of ionic hydrogen into the bulk beyond a few hundred Å can be neglected. Similarly, at the low temperature employed here (≦50° C.), diffusion of atomic hydrogen beyond 100 Å can be neglected. These conditions are quite different from those typically employed for bulk dopant or defect passivation—long exposures, high temperature, energetic ion bombardment.

To further evaluate the consequences of low-temperature (less than 100° C.) H$_2$ plasma passivation, we treated n-type GaAs with an ohmic contact on the back side of the wafer. On the front side, Schottky diodes were fabricated both prior to and after plasma treatment. No change was observed in the characteristics of the diodes formed prior to plasma treatment. However, for diodes fabricated on passivated areas of the same wafer (i.e. after plasma treatment), the barrier heights showed small but significant increases (Table 1). Consistent with a reduction in surface state density, we found barrier heights to depend slightly on the metal used to make the contact. The barrier heights are also close to those reported in the literature for clean GaAs prepared under UHV conditions. Note that such clean surfaces are still thought to be "pinned".

| Schottky Barrier Heights for n-GaAs | | | |
|---|---|---|---|
| Metal | n | φ(eV) | φ(eV) (clean GaAs)[b] |
| Au | 1.06 | 0.89 | 0.88 |
| Ti | 1.01 | 0.84 | 0.83 |
| Pt | 1.02 | 0.85 | — |

[a] For untreated n-GaAs: n = 1.02 and φ = 0.75 eV, where n = ideality factor, φ = barrier height.
[b] E. H. Rhoderick and R. H. Williams, Metal-Semiconductor Contacts, Claredon Press (Oxford 1988), p. 70.

The increases in Schottky barrier height shown in Table I are significant and useful for reducing leakage current in MES devices. The increases are also consistent with an increase in band-bending as the Fermi level shifts to a lower pinning position closer to the Ga antisite defect. Evidently, the increase in band bending is more than compensated for by the reduction in the near mid-gap As antisite defect state density.

Figure 4:
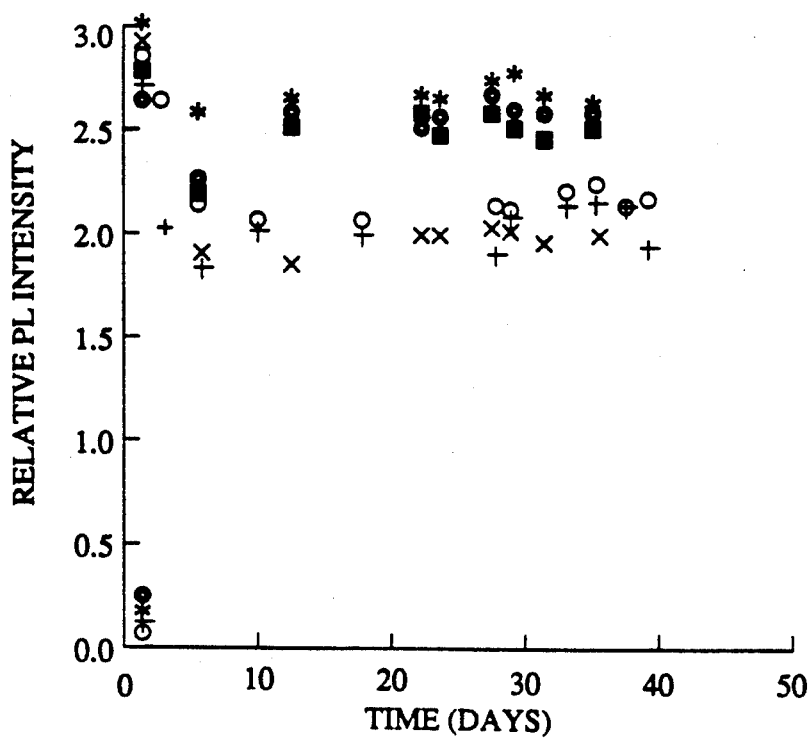
FIG. 4 is a plot of PL intensity vs. time in days, showing the long-term stability of surfaces treated in accordance with the invention.

With few exceptions, most plasma passivation treatments reported in the literature do not exhibit good long-term stability. In most cases, PL intensity degrades within hours after treatment. Seven samples were treated in accordance with the invention and mentioned for long term stability. The results appear in FIG. 4. The seven different symbols represent data points for the seven samples. As the data in FIG. 4 show, the long-term stability of the treatment of this invention here is excellent. Within the first few days, the PL intensity drops between 10 and 20% of its peak value (which is usually more than 10 times the initial value). After this period, the PL intensity remains constant within our experimental precision for at least 40 days.

We claim:

1. A method for passivating the surface of a III-V semiconductor comprising the steps of exposing the surface to a gas plasma having a major constituent of hydrogen for a period sufficient to passivate the surface, the invention characterized in that said plasma has a pressure greater than 1.5 Torr, and the temperature of the surface is less than 100 degrees centigrade for the duration of said exposure to hydrogen plasma.

2. The method of claim 1 in which the III-V semiconductor comprises gallium arsenide.

3. The method of claim 2 in which the semiconductor is gallium arsenide.

4. The method according to claim 1 wherein said pressure is at least 4 Torr and said substrate comprises gallium arsenide.

5. The method according to claim 1 wherein said temperature is less than 50 degrees centigrade and said substrate comprises gallium arsenide.

* * * * *